(12) United States Patent
Fukuda et al.

(10) Patent No.: US 10,404,905 B2
(45) Date of Patent: Sep. 3, 2019

(54) IMAGE SENSOR AND IMAGE CAPTURING APPARATUS

(71) Applicant: CANON KABUSHIKI KAISHA, Tokyo (JP)

(72) Inventors: Koichi Fukuda, Tokyo (JP); Junichi Saito, Kawasaki (JP); Yumi Takao, Nagareyama (JP); Yoshiaki Takada, Kawasaki (JP); Masaaki Iwane, Sagamihara (JP); Shoji Kono, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/478,426

(22) Filed: Apr. 4, 2017

(65) Prior Publication Data

US 2017/0295331 A1    Oct. 12, 2017

(30) Foreign Application Priority Data

Apr. 8, 2016  (JP) .................. 2016-078434
Sep. 12, 2016 (JP) .................. 2016-177864

(51) Int. Cl.
*H04N 5/232* (2006.01)
*H01L 27/146* (2006.01)
*H04N 5/369* (2011.01)

(52) U.S. Cl.
CPC ... *H04N 5/23212* (2013.01); *H01L 27/14605* (2013.01); *H01L 27/14627* (2013.01); *H01L 27/14638* (2013.01); *H04N 5/36961* (2018.08)

(58) Field of Classification Search
CPC ............. H04N 5/3696; H04N 5/23212; H04N 5/37452; H01L 27/14605; H01L 27/14627; H01L 27/14638
See application file for complete search history.

(56) References Cited

U.S. PATENT DOCUMENTS

2011/0164166 A1* 7/2011 Oikawa ............... G02B 7/36
                                                              348/340
2013/0083225 A1* 4/2013 Minowa ............ H01L 27/14607
                                                              348/294

FOREIGN PATENT DOCUMENTS

CN          10110914 A       1/2008
CN          102203655 A      9/2011
                (Continued)

OTHER PUBLICATIONS

The above foreign patent documents were cited in a Jun. 25, 2019 Chinese Office Action, a copy of which is enclosed with an English Translation, that issued in Chinese Patent Application No. 201710177592.8.

*Primary Examiner* — Twyler L Haskins
*Assistant Examiner* — Fayez Bhuiyan
(74) *Attorney, Agent, or Firm* — Cowan, Liebowitz & Latman, P.C.

(57) ABSTRACT

An image sensor comprising a pixel portion that is constituted by a plurality of pixels, and includes a first pixel group and a second pixel group, wherein each of the pixels included in the first pixel group and the second pixel group includes: a plurality of photoelectric conversion portions; and a plurality of transfer gates that respectively correspond to the photoelectric conversion portions, and have transfer gate electrodes covering same partial regions in the photoelectric conversion portions, and an average position of barycenters of respective light receivable regions of the photoelectric conversion portions included in each pixel of the first pixel group and an average position of barycenters of respective light receivable regions of the photoelectric conversion portions included in each pixel of the second pixel group are at positions different from each other in the pixels.

32 Claims, 9 Drawing Sheets

(56) References Cited

FOREIGN PATENT DOCUMENTS

| CN | 102263115 A | 11/2011 |
| CN | 102740006 A | 10/2012 |
| CN | 102801929 A | 11/2012 |
| JP | 2009-015164 A | 1/2006 |

* cited by examiner

FIG. 4A
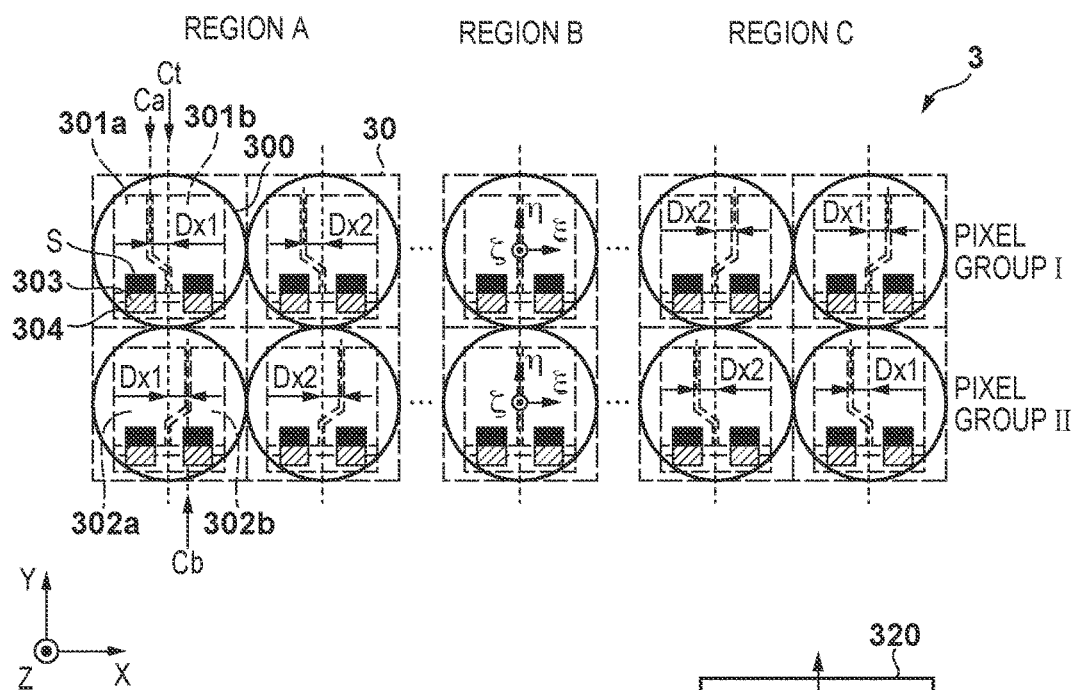
FIG. 4B
FIG. 4C
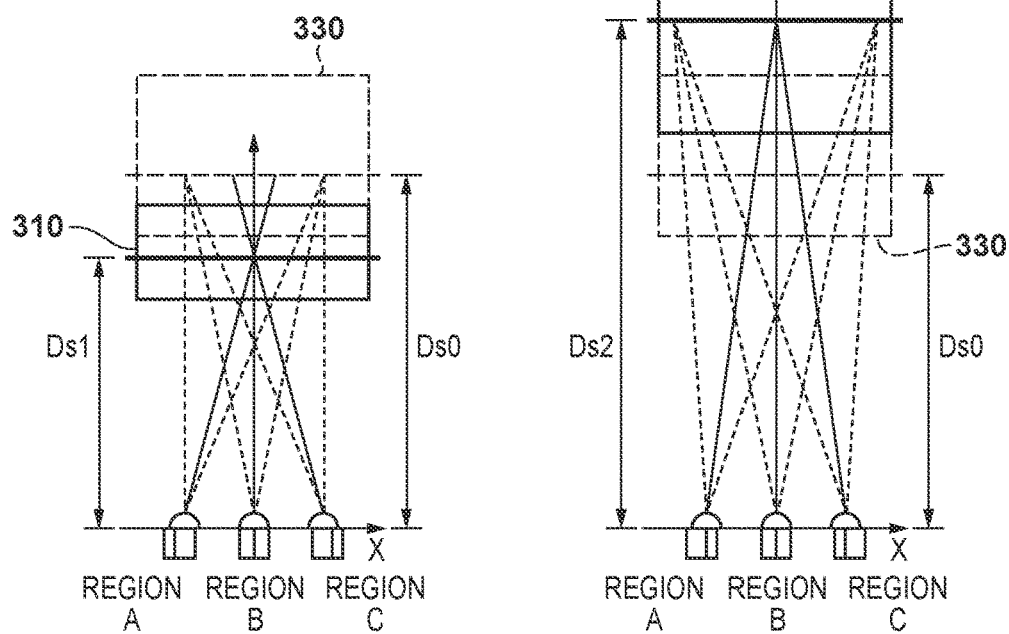

FIG. 6A
FIG. 6B
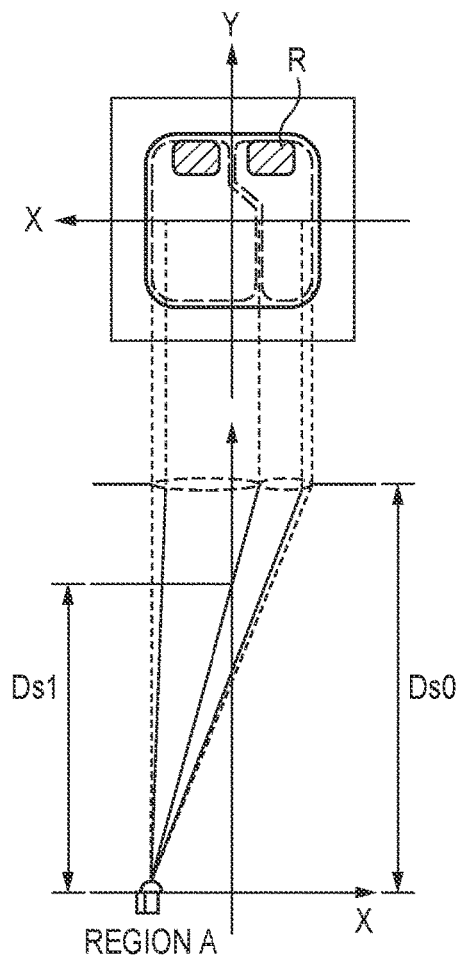
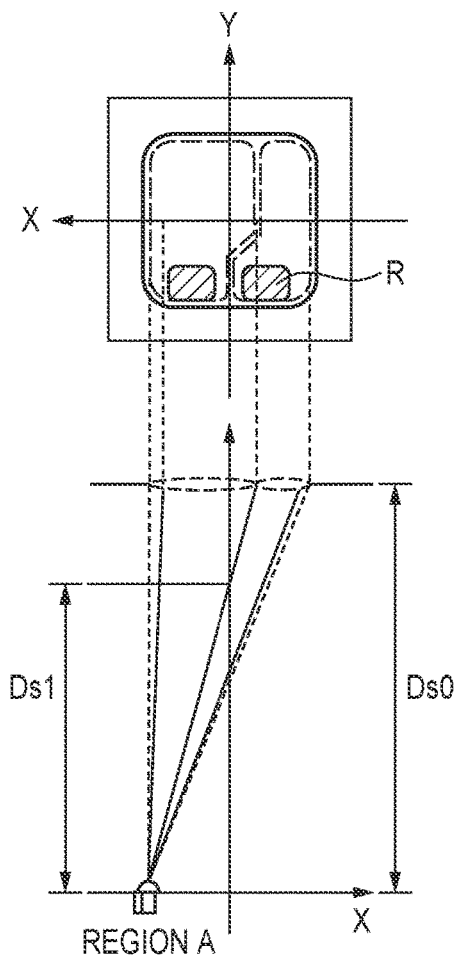

IMAGE SENSOR AND IMAGE CAPTURING APPARATUS

BACKGROUND OF THE INVENTION

Field of the Invention

The present invention relates to an image sensor and an image capturing apparatus and in particular relates to an image sensor that includes pixels having a focus detection function, and an image capturing apparatus.

Description of the Related Art

Techniques that use an image sensor for recording images to realize focus detection by a phase difference detection method in electronic cameras that can record moving images and still images have been proposed. In this on-imaging plane phase difference detection method, a light beam that has passed through the exit pupil of an imaging optical system is received by a pair of light receiving element groups for focus detection, and a shift amount between the signal waveforms of two paired images that are output according to the amount of the received light, namely, a relative position shift amount of the light beam that is generated in the pupil division direction, is detected. A focus shift amount (defocus amount) of the imaging optical system is then obtained from the detected relative position shift amount. Focus detection using this on-imaging plane phase difference detection method is characterized by being dependent on the arrangement of the focus detection pixels and the pupil division characteristic shape of the pixels, and thus various techniques regarding pixel structure and pixel arrangement for improving the characteristics of focus detection have been proposed.

Japanese Patent Laid-Open No. 2009-015164 discloses reducing an imbalance in pixel output by providing a plurality of pixel columns in which division positions of the photoelectric conversion portions are different, and selecting an optimal pixel column according to a decentering error of a microlens or a pupil change that depends on the type of an interchangeable lens and the image height.

However, in a case of realizing a structure in which the division positions of photoelectric conversion portions differ according to the image height as in Japanese Patent Laid-Open No. 2009-015164, imbalance in optical characteristics is newly caused as pixels, since transfer gate electrodes for transferring electric charges from the photoelectric conversion portions to a floating diffusion region are formed of a light shielding material.

Here, the imbalance in optical characteristics of pixels caused by transfer gate electrodes will be described. FIGS. 8A to 8E are schematic diagrams illustrating the pixel structure of an image sensor disclosed in Japanese Patent Laid-Open No. 2009-015164 that has pixel groups in which the division positions of the photoelectric conversion portions are different, and a state on the pupil surface formed by this pixel structure.

FIG. 8A depicts a pixel arrangement consisting of two rows and two columns, and imbalance in the light receiving amount for focus detection signals is reduced by adopting a structure in which the division center positions are different between the first row (a pixel group A) and the second row (a pixel group B). Transfer gate electrodes 803 that respectively correspond to photoelectric conversion portions 801a, 801b, 802a and 802b in which the division center positions are different and that are shown in FIG. 8A are arranged so as to partially cover the photoelectric conversion portions 801a, 801b, 802a and 802b. The transfer gate electrodes 803 control the potential of signal electric charges between the transfer gate electrodes 803 and an adjacent floating diffusion region 804.

The transfer gate electrodes 803 are designed according to the widths of the photoelectric conversion portions 801a, 801b, 802a and 802b in consideration of transfer efficiency. The transfer gate electrodes 803 are light-shielding members, and thus optically shield the photoelectric conversion regions of the photoelectric conversion portions 801a, 801b, 802a and 802b from light. With the structure of the photoelectric conversion portions 801a, 801b, 802a and 802b in which the division center positions are different, regions in which the transfer gate electrodes 803 optically restrict the photoelectric conversion portions 801a, 801b, 802a and 802b are different between the pixel group A and the pixel group B in which the division center positions are different.

FIG. 8B is a schematic diagram showing a state where a pixel of the pixel group A at a central image height separates a light beam on a pupil surface, and FIG. 8C is a schematic diagram showing a state where a pixel of the pixel group B at a central image height separates a light beam on a pupil surface, each showing, in an upper portion of the figure, the shape of the pixel shown in FIG. 8A projected on the pupil surface. In FIGS. 8B and 8C, a region 820 indicates a range of a pupil region in which the pixel receives light. In addition, regions 821a, 821b, 822a and 822b respectively indicate ranges of pupil regions in which the photoelectric conversion portions 801a, 801b, 802a and 802b receive light. Moreover, a region 823 indicates a range of a pupil region affected by light-shielding by the transfer gate electrode 803.

A circle 810 arranged at the center indicates a range formed by the aperture frame of the imaging optical system that is attached to the image sensor. Therefore, in actuality, the region inside this circle 810 is the range in which the pixel receives light. For the sake of simplification, in FIGS. 8B and 8C, an exit pupil distance Dl of the imaging optical system attached to the image sensor is substantially equal to a set pupil distance Ds of the image sensor, and the circle 810 indicates the aperture frame observed from a pixel at the central image height. As shown in FIGS. 8B and 8C, a region in which the transfer gate electrode 803 optically shields the photoelectric conversion portion from light is different between the pixel group A and the pixel group B, and thus the shapes of light receivable regions in the pixel group A and the pixel group B formed by the aperture frame are different. Therefore, the centroid of a light receivable region is different between the pixel group A and the pixel group B, causing the occurrence of horizontal stripes that are not preferable in a captured image.

Moreover, FIG. 8D is a schematic diagram showing a state where a pixel of the pixel group A at a peripheral image height separates a light beam on a plane at a set pupil distance Ds0 of the image sensor that is set according to the shrinking rate of the microlens, and FIG. 8E is a schematic diagram showing a state where a pixel of the pixel group B at a peripheral image height separates a light beam on a plane at the set pupil distance Ds0 of the image sensor that is set according to the shrinking rate of the microlens. Similarly to FIGS. 8B and 8C, the region 820 indicates a range in which the pixel receives light, and the regions 821a, 821b, 822a and 822b respectively indicate ranges of divided pupil regions in which the photoelectric conversion portions 801a, 801b, 802a and 802b receive light. In image capturing, signals of the regions 821a, 821b and the regions 822a and 822b respectively form captured images. The region 823 indicates a range affected by light receiving rate change caused by the transfer gate electrode 803. As shown in FIGS. 8D and 8E, a region in which the light receiving rate changes due to the transfer gate electrode 803 is different for each pixel. Therefore, the shape of the range in which the pixel group A receive light and the shape of the range in which the pixel group B receive light are different, causing the occurrence of horizontal stripes that are not preferable in a captured image.

SUMMARY OF THE INVENTION

The present invention has been made in consideration of the above situation, and provides a plurality of division patterns of a photoelectric conversion portion that are suitable for focus detection, while reducing the influence of the shapes of transfer gate electrodes that shield light on a captured image.

In addition, the present invention makes it possible to, in an image sensor that supports focus detection by an on-imaging plane phase difference method, appropriately perform focus detection in a broader range of a pupil distance of an imaging optical system, while reducing the influence of transfer gate electrodes on a captured image.

According to the present invention, provided is an image sensor comprising: a pixel portion that is constituted by a plurality of pixels, and includes a first pixel group and a second pixel group, wherein each of the pixels included in the first pixel group and the second pixel group includes: a plurality of photoelectric conversion portions; and a plurality of transfer gates that respectively correspond to the photoelectric conversion portions, and have transfer gate electrodes covering same partial regions in the photoelectric conversion portions, and an average position of barycenters of respective light receivable regions of the photoelectric conversion portions included in each pixel of the first pixel group and an average position of barycenters of respective light receivable regions of the photoelectric conversion portions included in each pixel of the second pixel group are at positions different from each other in the pixels.

According to the present invention, provided is an image sensor comprising: a pixel portion that is constituted by a plurality of pixels, and includes a first pixel group and a second pixel group, wherein each of the pixels included in the first pixel group and the second pixel group includes: a plurality of photoelectric conversion portions; a division band that separates the photoelectric conversion portions; and a plurality of transfer gates that respectively correspond to the photoelectric conversion portions, and have transfer gate electrodes covering same partial regions in the photoelectric conversion portions, and a position of the division band included in the first pixel group relative to barycenters of respective light receivable regions of the photoelectric conversion portions included in each pixel of the first pixel group and a position of the division band included in the second pixel group relative to barycenters of respective light receivable regions of the photoelectric conversion portions included in each pixel of the second pixel group are at positions different from each other in the pixels.

Further, according to the present invention, provided is an image sensor comprising: a pixel portion that is constituted by a plurality of pixels, and includes a first pixel group and a second pixel group, wherein each of the pixels included in the first pixel group and the second pixel group includes: a plurality of photoelectric conversion portions; and a plurality of transfer gates that respectively correspond to the photoelectric conversion portions, and have transfer gate electrodes covering same partial regions in the photoelectric conversion portions, and in the first pixel group and the second pixel group, a division boundary of the photoelectric conversion portions changes according to an image height in a division direction of the photoelectric conversion portions, such that pupil regions at predetermined pupil distances different from each other are substantially equally divided regardless of the image height.

Furthermore, according to the present invention, provided is an image sensor comprising: a pixel portion that is constituted by a plurality of pixels, and includes a first pixel group and a second pixel group, wherein each of the pixels included in the first pixel group and the second pixel group includes: a plurality of photoelectric conversion portions; and a plurality of transfer gates that respectively correspond to the photoelectric conversion portions, and have transfer gate electrodes covering partial regions of a same size in the photoelectric conversion portions, the pixel portion has a plurality of storage portions for storing electric charges transferred from the photoelectric conversion portions via the transfer gates, each of the storage portions store the electric charges transferred from the photoelectric conversion portions of a plurality of pixels facing each other with the transfer gates therebetween, and in the first pixel group and the second pixel group, a division boundary of the photoelectric conversion portions changes according to an image height in a division direction of the photoelectric conversion portions, such that pupil regions at predetermined pupil distances different from each other are substantially equally divided regardless of the image height.

Further, according to the present invention, provided is an image sensor comprising: a pixel portion that is constituted by a plurality of pixels, and includes a first pixel group and a second pixel group, wherein each of the pixels included in the first pixel group and the second pixel group includes: a plurality of photoelectric conversion portions whose light receiving surfaces are divided in a predetermined division direction at a predetermined division boundary; and a plurality of transfer gates that respectively correspond to the photoelectric conversion portions, and have transfer gate electrodes covering same partial regions in the photoelectric conversion portions, and division boundaries included in the first pixel group and the second pixel group change in opposite directions relative to the division direction according to an image height on the light receiving surface.

Furthermore, according to the present invention, provided is an image capturing apparatus comprising: an image sensor including a pixel portion that is constituted by a plurality of pixels, and includes a first pixel group and a second pixel group, wherein each of the pixels included in the first pixel group and the second pixel group includes: a plurality of photoelectric conversion portions; and a plurality of transfer gates that respectively correspond to the photoelectric conversion portions, and have transfer gate electrodes covering same partial regions in the photoelectric conversion portions, and an average position of barycenters of respective light receivable regions of the photoelectric conversion portions included in each pixel of the first pixel group and an average position of barycenters of respective light receivable regions of the photoelectric conversion portions included in each pixel of the second pixel group are at positions different from each other in the pixels; and a lens for collecting light from an object to the image sensor.

Furthermore, according to the present invention, provided is an image capturing apparatus comprising: an image sensor including a pixel portion that is constituted by a plurality of pixels, and includes a first pixel group and a second pixel group, wherein each of the pixels included in the first pixel group and the second pixel group includes: a plurality of photoelectric conversion portions; a division band that separates the photoelectric conversion portions; and a plurality of transfer gates that respectively correspond to the photoelectric conversion portions, and have transfer gate electrodes covering same partial regions in the photoelectric conversion portions, and a position of the division band included in the first pixel group relative to barycenters of respective light receivable regions of the photoelectric conversion portions included in each pixel of the first pixel group and a position of the division band included in the second pixel group relative to barycenters of respective light receivable regions of the photoelectric conversion portions included in each pixel of the second pixel group are at positions different from each other in the pixels; and a lens for collecting light from an object to the image sensor.

Furthermore, according to the present invention, provided is an image capturing apparatus comprising: an image sensor including a pixel portion that is constituted by a plurality of pixels, and includes a first pixel group and a second pixel group, wherein each of the pixels included in the first pixel group and the second pixel group includes: a plurality of photoelectric conversion portions; and a plurality of transfer gates that respectively correspond to the photoelectric conversion portions, and have transfer gate electrodes covering same partial regions in the photoelectric conversion portions, and in the first pixel group and the second pixel group, a division boundary of the photoelectric conversion portions changes according to an image height in a division direction of the photoelectric conversion portions, such that pupil regions at predetermined pupil distances different from each other are substantially equally divided regardless of the image height; and a lens for collecting light from an object to the image sensor.

Furthermore, according to the present invention, provided is an image capturing apparatus comprising: an image sensor including a pixel portion that is constituted by a plurality of pixels, and includes a first pixel group and a second pixel group, wherein each of the pixels included in the first pixel group and the second pixel group includes: a plurality of photoelectric conversion portions; and a plurality of transfer gates that respectively correspond to the photoelectric conversion portions, and have transfer gate electrodes covering partial regions of a same size in the photoelectric conversion portions, the pixel portion has a plurality of storage portions for storing electric charges transferred from the photoelectric conversion portions via the transfer gates, each of the storage portions store the electric charges transferred from the photoelectric conversion portions of a plurality of pixels facing each other with the transfer gates therebetween, and in the first pixel group and the second pixel group, a division boundary of the photoelectric conversion portions changes according to an image height in a division direction of the photoelectric conversion portions, such that pupil regions at predetermined pupil distances different from each other are substantially equally divided regardless of the image height; and a lens for collecting light from an object to the image sensor.

Furthermore, according to the present invention, provided is an image capturing apparatus comprising: an image sensor comprising a pixel portion that is constituted by a plurality of pixels, and includes a first pixel group and a second pixel group, wherein each of the pixels included in the first pixel group and the second pixel group includes: a plurality of photoelectric conversion portions whose light receiving surfaces are divided in a predetermined division direction at a predetermined division boundary; and a plurality of transfer gates that respectively correspond to the photoelectric conversion portions, and have transfer gate electrodes covering same partial regions in the photoelectric conversion portions, and division boundaries included in the first pixel group and the second pixel group change in opposite directions relative to the division direction according to an image height on the light receiving surface; and a lens for collecting light from an object to the image sensor.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 4A to 4C are schematic diagrams showing pixel configurations of an image sensor and states on a pupil surface of an imaging optical system according to a third embodiment;

FIGS. 6A and 6B are schematic diagrams showing different states on a pupil surface of an imaging optical system due to different positions of a transfer gate electrode of the image sensor according to the fourth embodiment;

DESCRIPTION OF THE EMBODIMENTS

Exemplary embodiments of the present invention will be described in detail in accordance with the accompanying drawings.

First Embodiment

Figure 1A:
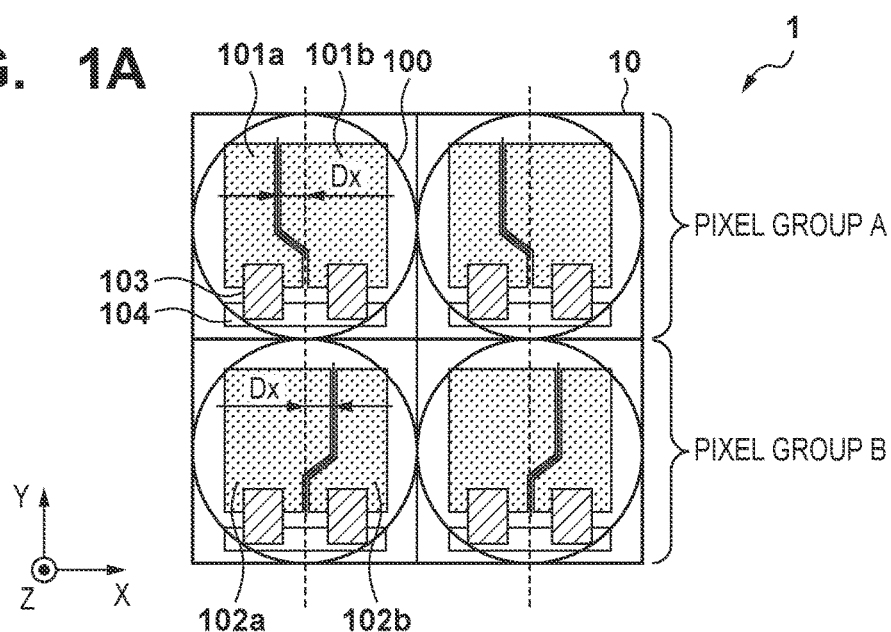
FIGS. 1A to 1C are schematic diagrams showing pixel configurations of an image sensor and states on a pupil surface of an imaging optical system according to a first embodiment of the present invention.
Figure 1B:
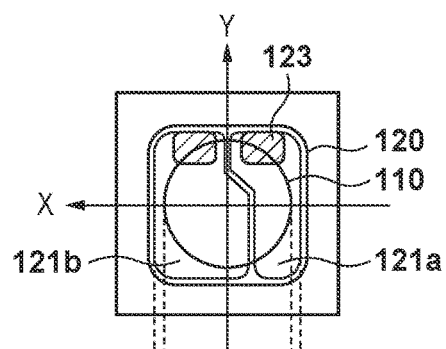
Figure 1B:
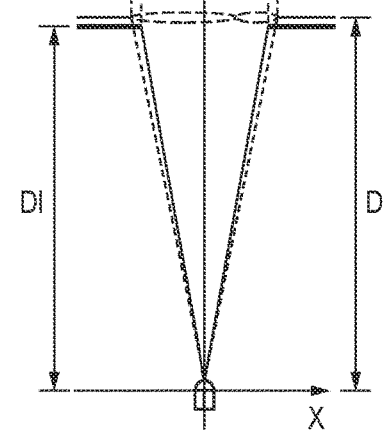
Figure 1C:
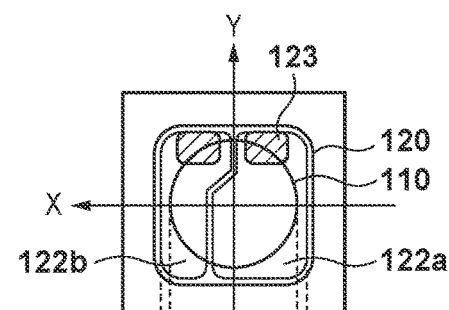

FIGS. 1A to 1C are schematic diagrams showing the pixel configurations of an image sensor 1 in a first embodiment of the present invention, and states on a pupil surface of an imaging optical system. FIG. 1A is a plan view of a two-dimensional plane on which a plurality of pixels 10 (pixel portions) constituting the image sensor 1 are arranged, when observed from the side on which light enters, and shows only four pixels constituted by two rows and two columns of the two-dimensional arrangement of the pixels 10. The pixels 10 in the upper row are referred to as a pixel group A, and the pixels 10 in the lower row are referred to as a pixel group B.

Each of the pixels 10 has one microlens 100, and has a plurality of photoelectric conversion portions 101*a* and 101*b* or 102*a* and 102*b* arranged on the lower side in the Z direction in FIG. 1A. Floating diffusion regions 104 are arranged next to the photoelectric conversion portions 101a and 101b, and the photoelectric conversion portions 102a and 102b. Transfer gate electrodes 103, which are gates of transfer transistors, respectively transfer electric charges generated in the photoelectric conversion portions 101a, 101b, 102a and 102b to the connected floating diffusion regions 104. Each of the floating diffusion regions 104 is configured to be shared by the photoelectric conversion portions 101a and 101b or 102a and 102b. The transfer gate electrodes 103 and the photoelectric conversion portions 101a, 101b, 102a and 102b are configured to have overlapping regions on the pixel arrangement plane, when viewed from the Z direction. At this time, the overlapping regions are designed to have the same shape and to be at the same position in the pixels 10 regardless of the pixel group A or the pixel group B. Note that the floating diffusion region 104 is equivalent to a storage portion that holds electric charges generated in the photoelectric conversion portions.

Next, pixel groups of the image sensor 1 in the first embodiment will be described. As shown in FIG. 1A, the shapes of the photoelectric conversion portions 101a and 101b of the pixel group A are different, and the shapes of the photoelectric conversion portions 102a and 102b of the pixel group B are different. Specifically, the division boundary of the photoelectric conversion portions 101a and 101b constituting the pixel group A is offset on a −X side relative to the pixel center (broken line) by Dx. On the other hand, the division boundary of the photoelectric conversion portions 102a and 102b constituting the pixel group B is offset on a +X side relative to the pixel center by Dx. Accordingly, in the pixel group A, each pixel is divided on the −X side relative to the center of the exit pupil, and in the pixel group B, each pixel is divided on the +X side relative to the center of the exit pupil, and photoelectric conversion is performed in the divided photoelectric conversion portions. This indicates that the barycenters of the photoelectric conversion portions 101a, 101b, 102a and 102b are offset in the opposite directions to each other between the pixel groups, and indicates a configuration in which the barycenter of the light receiving surfaces totaled in units of pixels is the same between the pixel groups. Note that in this embodiment, the division boundary on which the photoelectric conversion portions 101a and 101b are divided is equivalent to a division band. In particular, the division band in the vicinity of the overlapping region is equivalent to a first division band, and the division band in the vicinity of the region in which the division boundary is offset is equivalent to a second division band.

FIG. 1B is a schematic diagram showing a state where a pixel of the pixel group A separates a light beam on a pupil surface, and FIG. 1C is a schematic diagram showing a state where a pixel of the pixel group B separates a light beam on a pupil surface, each Figure showing, in an upper portion thereof, the shape of the pixel shown in FIG. 1A projected on the pupil surface. In FIGS. 1B and 1C, a region 120 indicates a range of the pupil region in which the pixel 10 receives light. In addition, the regions 121a, 121b, 122a, and 122b respectively indicate the ranges of the pupil regions in which the photoelectric conversion portions 101a, 101b, 102a and 102b receive light. Moreover, a region 123 indicates a range of the pupil region affected by light-shielding due to the transfer gate electrode 103.

A circle 110 arranged at the center indicates a range formed by the aperture frame of the imaging optical system that is attached to the image sensor 1. Therefore, in actuality, the region inside this circle 110 serves as a range in which the pixel 10 receives light. For the sake of simplification, in FIGS. 1B and 1C, an exit pupil distance Dl of the imaging optical system attached to the image sensor 1 is substantially equal to a set pupil distance Ds of the image sensor 1, and the circle 110 illustrates the aperture frame observed from a pixel at the central image height.

It can be recognized that if the above-described pixel structure of the image sensor 1 is adopted, a light shielding state due to the transfer gate electrode 103 is the same in a region obtained by adding the divided photoelectric conversion portions 101a and 101b and used as a captured image, and in a region obtained by adding the divided photoelectric conversion portions 102a and 102b and used as a captured image. Accordingly, the shape of the light receivable region formed through the aperture frame is the same in the pixel group A and the pixel group B, and thus it is possible to exclude the cause of horizontal stripes in a captured image.

Figure 2:
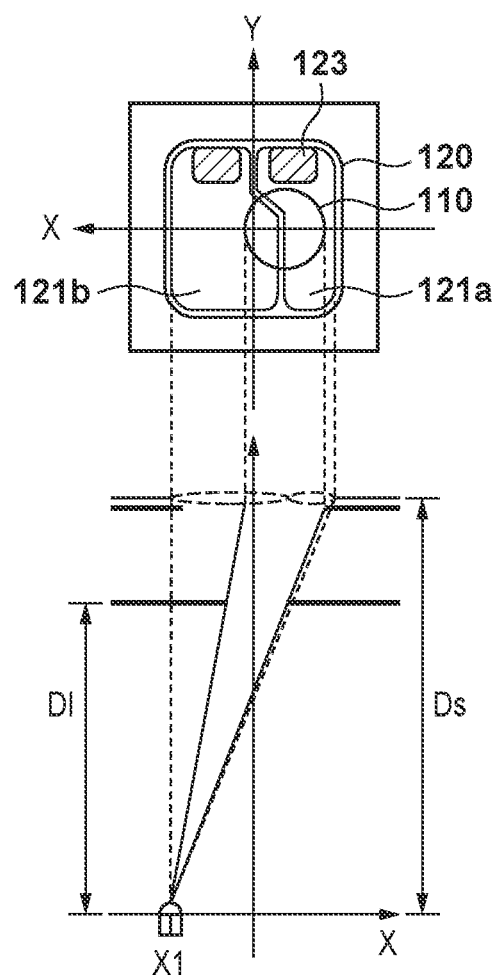
FIG. 2 is a schematic diagram showing a pixel at an image height X1 and a state on a pupil surface of an imaging optical system according to the first embodiment.

FIG. 2 is a schematic diagram showing an aperture frame and a state of pupil separation of the pixel 10 of the pixel group A at the image height X1 in the −X direction, in the case where the exit pupil distance Dl of the imaging optical system that is attached to the image sensor 1 in the first embodiment is shorter than the set pupil distance Ds of the image sensor 1. As is clear from this figure, at an image height on the −X side, pupil separation by the pixel 10 of the pixel group A can reduce the loss in light amount balance of two images that are separated, and thus make it possible to perform more accurate focus detection. On the other hand, regarding the +X direction, the state of the pixel 10 of the pixel group B is the same as the pixel group A, and thus it is possible to adapt to an imaging optical system in which the exit pupil distance Dl is short by selecting an appropriate pixel group according to the image height. The relationship in the case where the exit pupil distance Dl is longer than the set pupil distance Ds of the image sensor 1 (not illustrated) is the inversion of the above-described relationship, and also in this case, the accuracy of focus detection can be improved by selecting an appropriate pixel group.

As described above, according to the first embodiment, it is possible to provide a plurality of division patterns of a photoelectric conversion portion that are suitable for focus detection, while reducing the influence of the shapes of transfer gate electrodes that shield light on the captured image.

Second Embodiment

Figure 3:
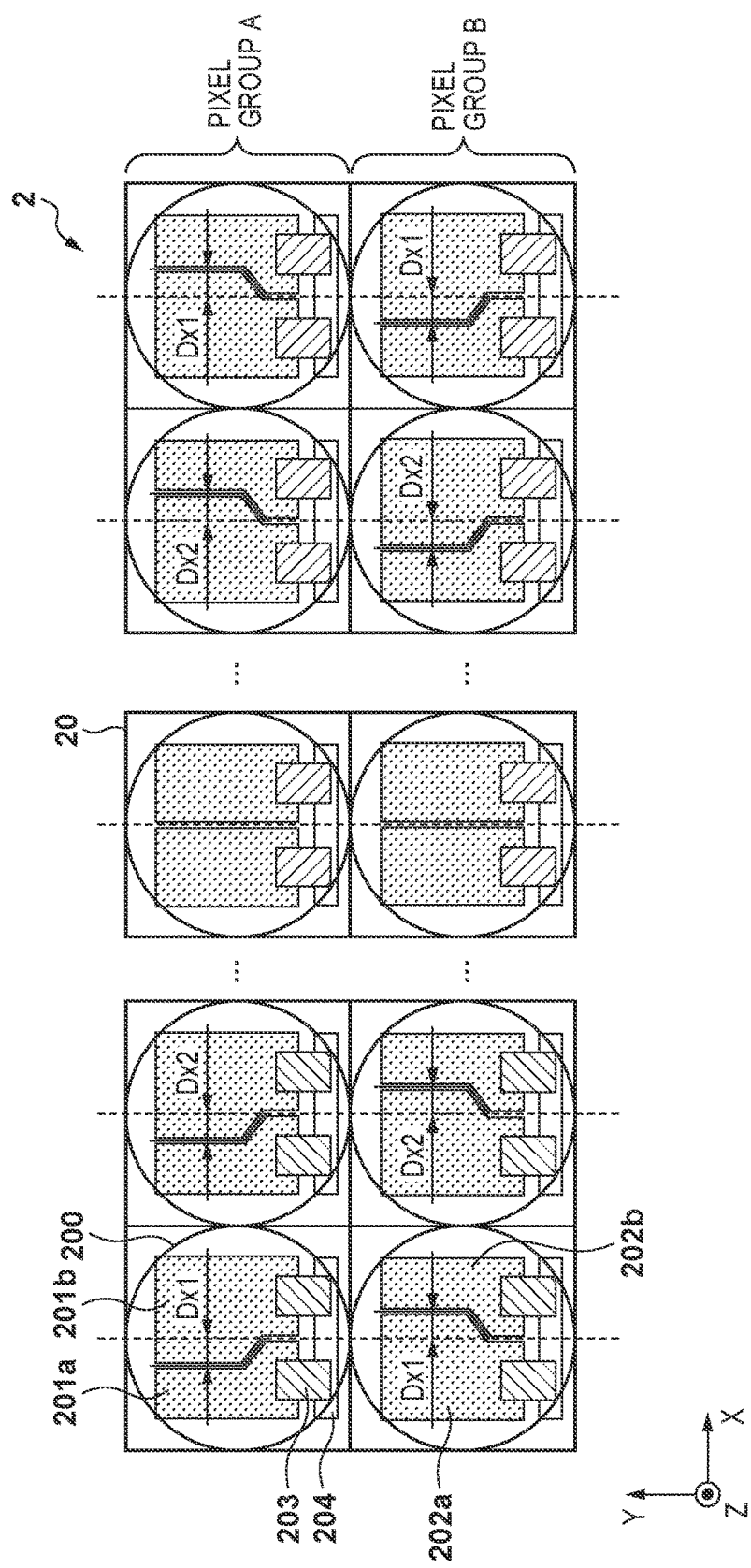
FIG. 3 is a schematic diagram showing pixel configurations of an image sensor according to a second embodiment.

FIG. 3 is a schematic diagram for illustrating the pixel structure of an image sensor 2 in a second embodiment of the present invention. FIG. 3 is a plan view of a two-dimensional plane on which a plurality of pixels 20 constituting the image sensor 2 are arranged, when observed from a side on which light enters, and shows only 10 pixels in total arranged at positions at which the image height is highest in the ±X axis directions and a position at the central image height, out of the two-dimensional arrangement of the pixels 20. The pixels 20 in the upper row are arranged as a pixel group A, and the pixels 20 in the lower row are arranged as a pixel group B.

Each of the pixels 20 has one microlens 200, and photoelectric conversion portions 201a and 201b, or 202a and 202b are arranged on a lower side in the Z direction in FIG. 3. A floating diffusion region 204 is arranged next to the photoelectric conversion portions 201a and 201b, or 202a and 202b. Transfer gate electrodes 203, which are gates of transfer transistors, transfer electric charges generated in the photoelectric conversion portions 201a, 201b, 202a and 202b respectively to the floating diffusion regions 204. The floating diffusion region 204 is shared by a plurality of photoelectric conversion portions, namely, 201a and 201b or 202a and 202b. The transfer gate electrodes 203 and each of the photoelectric conversion portions 201a, 201b, 202a and 202b are configured to have an overlapping portion on the pixel arrangement plane, when viewed from the Z direction. Here, the overlapping portions are arranged in the same direction regardless of the pixel group A or the pixel group B. In other words, the overlapping portions are designed to have the same shape and to be at the same position in the pixel 20.

Next, pixel groups of the image sensor 2 in the second embodiment will be described. As shown in FIG. 3, the shapes of the photoelectric conversion portions 201a and 201b of the pixel group A are different from each other, and the shapes of the photoelectric conversion portions 202a and 202b of the pixel group B are different from each other. The leftmost column will be described as an example. The division boundary of the photoelectric conversion portions 201a and 201b of the pixel group A is offset on the −X side relative to the center of the pixel 20 (a dot-and-dash line) by Dx1, and the division boundary of the photoelectric conversion portions 202a and 202b of the pixel group B is offset on the +X side relative to the pixel center by Dx1. A relationship of offset by ±Dx2 is adopted in the next column, and offset is eliminated at the central image height (in the third column), where the division boundaries match.

The offset relationship is replaced so as to be symmetric relative to the central image height (the third column), and in the rightmost column, the division boundary of the photoelectric conversion portions 201a and 201b of the pixel group A is offset on the +X side relative to the center of the pixels 20 (a dot-and-dash line) by Dx1. On the other hand, the division boundary of the photoelectric conversion portions 202a and 202b of the pixel group B is offset on the −X side relative to the pixel center by Dx1. Accordingly, in the pixel group A and the pixel group B, the average position of the barycenters of light receiving surfaces of the divided photoelectric conversion portions 201a and 201b and the average position of the barycenters of light receiving surfaces of the divided photoelectric conversion portions 202a and 202b are separated from each other according to the increase in the image height. With such a configuration, focus detection pixels for dividing more appropriate pupil regions according to the image height are arranged for each image height, and thereby a flexible approach can be taken for cases such as where the pupil distance of the imaging optical system changes a large amount in an interchangeable lens system or the like.

Note that as shown in FIG. 3, the division position of the photoelectric conversion portions 201a and 201b and the division position of the photoelectric conversion portions 202a and 202b each include a location in which the division boundary is offset from the pixel center and a location in which the division boundary is not offset. The location in which the division boundary is not offset is in a region adjacent to the transfer gate electrode 203. Furthermore, the transfer gate electrodes 203 are all configured to have the same shape. As described above, a portion of each of the photoelectric conversion portions 201a, 201b, 202a and 202b is covered by the transfer gate electrode 203. The transfer gate electrodes 203 are not made of a light transmissive material, and thus the regions of the photoelectric conversion portions 201a, 201b, 202a and 202b that are covered by the transfer gate electrodes 203 will be shielded from light. At this time, the totaled region of the photoelectric conversion portions 201a and 201b constituting the pixel group A as well as the totaled region of the photoelectric conversion portions 202a and 202b constituting the pixel group B are equally shielded from light by the transfer gate electrodes 203. Accordingly, as described above, an issue of a conventional technique for forming a pupil region that is different for each pixel group will be overcome.

The image sensor 2, which is the second embodiment of the present invention, makes it possible to provide a plurality of division patterns of a photoelectric conversion portion that are suitable for focus detection, while enabling shooting that does not adversely affect the captured image.

Note that in the first and second embodiments above, photoelectric conversion portions are divided on the boundaries that are all straight lines, but the present invention is not limited thereto, and curved lines may be used for the division. Moreover, in the first and second embodiments above, pupil division is limited to division into two, but the present invention is not limited thereto, and, for example, division into three or more regions such as division into four may be used. Even in this case, if the overlapping portions of the transfer gate electrodes and the photoelectric conversion portions in all the pixel groups have the same shape and are at the same relative position, a similar effect can be obtained.

Note that in the first and second embodiments above, pixel groups of two types have been described as the pixel group A and the pixel group B, but the present invention is not limited thereto. For example, if color filters in a Bayer array are included, a pixel group may be constituted by pixels in which a filter of the same color is arranged.

Third Embodiment

FIGS. 4A to 4C are schematic diagrams showing the pixel configuration of an image sensor 3 in a third embodiment of the present invention, and a state on a pupil surface of an imaging optical system. FIG. 4A is a plan view of a two-dimensional plane (pixel portion) on which a plurality of pixels 30 constituting the image sensor 3 are arranged, when observed from a side on which light enters. FIG. 4A shows only four pixels constituted by two rows and two columns arranged in a region A in which the image height is high in the −X direction, two pixels constituted by two rows and one column arranged in a region B in the vicinity of the center of the image sensor 3 and four pixels constituted by two rows and two columns arranged in a region C in which the image height is high in the +X direction, out of the two-dimensional arrangement of the pixels 30.

Each of the pixels 30 has one microlens 300, and on a lower side in the Z direction in FIG. 4A, photoelectric conversion portions 301a and 301b are arranged in a pixel group I, and photoelectric conversion portions 302a and 302b are arranged in a pixel group II. The photoelectric conversion portions 301a, 301b, 302a and 302b are each divided in the X direction for focus detection that uses the phase difference on the image capturing plane. The signals of the totaled region of the photoelectric conversion portions 301a and 301b for each pixel and the signals of the totaled region of the photoelectric conversion portions 302a and 302b for each pixel are used in image capturing. The barycenter of this totaled region is positioned substantially at the pixel center regardless of pixel group or image height.

A floating diffusion region 304 (storage portion) is arranged in a region adjacent to the photoelectric conversion portions 301a and 301b in the −Y direction, and in a region adjacent to the photoelectric conversion portions 302a and 302b in the −Y direction. The transfer gate electrodes 303, which are gates of transfer transistors, transfer electric charges generated in the photoelectric conversion portions 301a, 301b, 302a and 302b to the connected floating diffusion regions 304. The floating diffusion region 304 is configured to be shared by the photoelectric conversion portions 301a and 301b or 302a and 302b, and holds the electric charges transferred via the connected transfer gates. The transfer gate electrode 303 and each of the photoelectric conversion portions 301a, 301b, 302a and 302b are configured to have an overlapping portion S in which a portion of the region is overlapped, when viewed from the Z direction. At this time, the overlapping portions S are designed to have the same shape and to be at the same position in the ξηζ coordinate system at the pixel center of each pixel, regarding all the pixel groups. This is for suppressing horizontal stripes that occur due to variation in region in which light receiving rate change is caused due to the transfer gate electrode 303, for each of the above-described pixel groups.

Next, pixel groups of the image sensor 3 in the third embodiment will be described. As shown in FIG. 4A, the shapes of the photoelectric conversion portions 301a and 301b of the pixel group I are different from each other, and the shapes of the photoelectric conversion portions 302a and 302b of the pixel group II are different from each other. Accordingly, in the left column of the region A, the division boundary of the photoelectric conversion portions 301a and 301b constituting the pixel group I is offset on the −X side relative to the pixel center by Dx1. On the other hand, the division boundary of the photoelectric conversion portion 302a and 302b constituting the pixel group II is offset on the +X side relative to the pixel center by Dx1. Accordingly, a barycenter Ct of the totaled light receiving surface of the photoelectric conversion portions 301a and 301b or 302a and 302b is substantially at the pixel center and is the same for each of the pixels. In contrast, an average position Ca of the barycenters of the light receiving surfaces of the photoelectric conversion portions 301a and 301b and an average position Cb of the barycenters of the light receiving surfaces of the photoelectric conversion portions 302a and 302b are mutually different positions that are symmetrical relative to the pixel center axis in the X direction. In other words, the directions in which the division boundaries are offset are opposite between the pixel group I and the pixel group II. Note that in this embodiment, a light receiving surface is divided on a division boundary in the X direction, and this X direction is equivalent to the division direction.

This offset relationship is a relationship of offset by ±Dx2 (Dx2<Dx1) in the right column of the region A. Similarly, the offset amount gradually decreases toward the center of the image sensor 3, and the offset is eliminated in the region B in the vicinity of the center. Furthermore, offset relationships are alternated so as to be symmetric relative to the central image height, and in the right column of the region C, the division boundary is offset on the +X side relative to the pixel center by Dx1 in the pixel group I, and the division boundary is offset on the −X side by Dx1 in the pixel group II. Accordingly, the average position in the division direction of the barycenters of a plurality of photoelectric conversion portions in a pixel of the pixel group I and that of the pixel group II will be separated from the pixel center in the opposite directions to each other according to the increase in image height. With such a configuration, it is possible to realize an image sensor in which the set pupil distance is different for each pixel group. Note that the difference in set pupil distance for each pixel group will be described later with reference to FIGS. 4B and 4C.

Note that in the vicinity of the transfer gate electrode 303, the division boundary is positioned in the vicinity of the pixel center in order for the overlapping portions S to have the same shape and be at the same position. Therefore, if a plurality of photoelectric conversion portions included in each pixel are totaled in consideration of the overlapping portions S, the shape (projection) is the same regarding the pixel group I and the pixel group II. Therefore, it becomes possible to suppress horizontal stripes that occur due to a difference in the region in which light receiving rate change occurs.

FIGS. 4B and 4C are schematic diagrams showing states where a light beam is separated on the pupil surface by the pixel group I and the pixel group II of the image sensor 3 in the third embodiment. FIGS. 4B and 4C respectively show states where the pixels of the pixel group I and the pixel group II separate a light beam in the regions A, B and C on the pupil surface. A distance Ds0 indicates the set pupil distance (reference pupil distance) of the image sensor 3 that is set by the microlens 300 being arranged to have a shrinking rate from the image height center.

As described above, the principal ray of a light beam that enters the pixels in the regions A, B and C intersects the optical axis at a distance Ds1 by changing the offset amount for each region in the X direction, which is the division direction of the photoelectric conversion portions 301a and 301b, or 302a and 302b (FIG. 4B). This means that the pixel group I is equivalent to a sensor that has the set pupil distance Ds1, which is shorter than the set pupil distance Ds0 of the image sensor 3 that is determined based on the above-described shrinking rate. In this case, the photoelectric conversion portions 301a and 301b of the pixel group I substantially equally divide the pupil region at the set pupil distance Ds1 regardless of the image height.

On the other hand, the pixel group II is equivalent to a sensor that has a set pupil distance Ds2 that is longer than the set pupil distance Ds0 of the image sensor 3 that is determined based on the above-described shrinking rate, as shown in FIG. 4C. In this case, the photoelectric conversion portions 302a and 302b of the pixel group II substantially equally divide the pupil region at the set pupil distance Ds2, regardless of the image height.

In this manner, in an image sensor that has a set pupil distance different for each pixel group, it is possible to realize an improvement in focus detection accuracy in high image height regions separated from the screen center in the ±X direction, by selecting a pixel group suitable for the attached imaging optical system.

Note that in the third embodiment, the photoelectric conversion portions 301a and 301b, and 302a and 302b are divided in the X direction, but the present invention is not limited thereto, and even in the case of division in the Y direction orthogonal to the X direction, focus detection accuracy can also be improved in a high image height region in the Y direction. In addition, a case has been described in which the image sensor 3 is provided with two pixel groups, namely, the pixel group I and the pixel group II, but a configuration may be adopted in which the image sensor 3 is provided with three or more pixel groups having different set pupil regions.

Next, a desirable relationship between a set pupil distance and a minimum value Dl1 and a maximum value Dl2 of the exit pupil distance of the imaging optical system that is combined with the image sensor 3 will be described. First, the minimum pupil distance Ds1 and the maximum pupil distance Ds2 of the two pixel groups satisfy the following condition (1), so as to be able to adapt to the change of the exit pupil distance of the attached imaging optical system from Dl1 to Dl2.

$$Ds2 > Ds0 > Ds1 \quad (1)$$

Furthermore, a method for determining the set pupil distance Ds0 of the image sensor 3 will be described. A region 310 in FIG. 4B indicates a range of the exit pupil distance of the imaging optical system in which the set pupil distance Ds1 can adapt to focus detection, and a region 320 in FIG. 4C indicates a range of the exit pupil distance of the imaging optical system in which the set pupil distance Ds2 can adapt to focus detection. Note that "a range of the exit pupil distance of the imaging optical system . . . can adapt to . . . " means that the ratio of the sizes of the pupil regions corresponding to the photoelectric conversion portions 301a and 301b, and 302a and 302b is within a predetermined range, and refers to a range in which focus detection can be performed with sufficient accuracy. It can be realized that the image sensor 3 can cover a wide exit pupil distance range if the set pupil distance is different for each pixel group. It is desirable to make the settings such that the change range (Dl1 to Dl2) of the exit pupil distance of the attached imaging optical system is substantially within this adaptable exit pupil distance range. Specifically, the set pupil distance Ds0 is determined based on the following condition (2).

$$(1/Ds1 + 1/Ds2)/2 = 1/Ds0 \quad (2)$$

Accordingly, Ds0 is set such that the inverse number 1/Ds0 of the set pupil distance Ds0 that is set based on the shrinking rate of the microlens 300 substantially matches the inverse average of the minimum value and the maximum value (Ds1 and Ds2) of the pupil distance of the imaging optical system. In addition, a region 330 indicates a range of the exit pupil distance of the imaging optical system that can adapt to focus detection using conventional pixels in which the photoelectric conversion portion is divided at the center of the pixel. A group of such pixels is assumed to be a pixel group III (not illustrated), and the conventional pixels in which the photoelectric conversion portion is divided at the center of the pixel are arranged, and thereby this region is covered as a region in which focus detection is possible. Accordingly, it becomes possible to realize an image sensor that covers, widely in a balanced manner, the range of the exit pupil distances Dl1 to Dl2 of the imaging optical system that changes while including the set pupil distance Ds0.

As described above, according to the third embodiment, in the image sensor 3, it is possible to provide a plurality of set pupil distances based on a plurality of division patterns of a photoelectric conversion portion that are suitable for focus detection, while reducing the influence of the shapes of transfer gate electrodes that shield light on the captured image.

Fourth Embodiment

Figure 5:
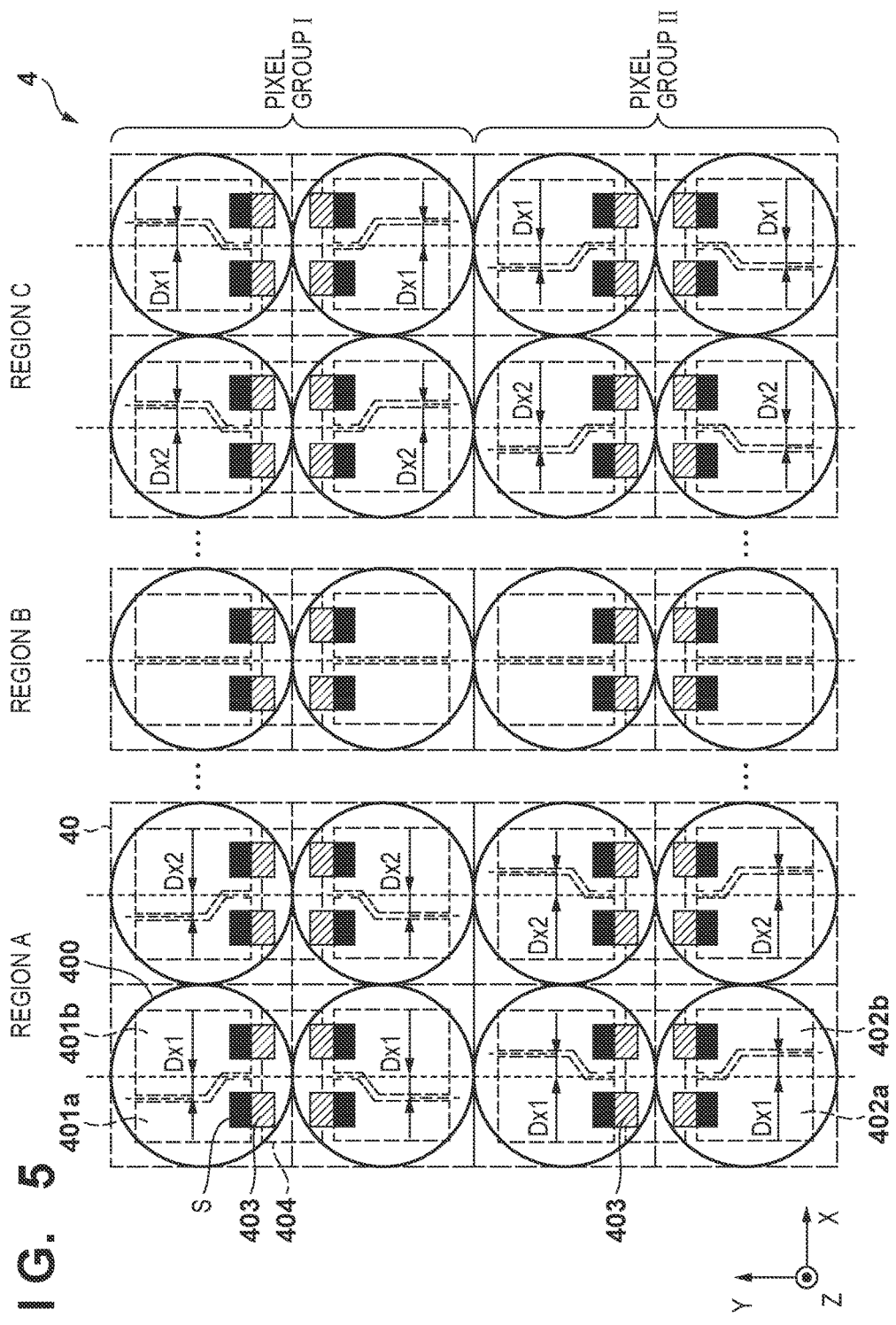
FIG. 5 is a schematic diagram showing pixel configurations of an image sensor according to a fourth embodiment.

Next, a fourth embodiment of the present invention will be described. FIG. 5 is a schematic diagram showing the pixel configuration of an image sensor 4, which is the fourth embodiment of the present invention, and is a plan view showing an example in which transfer gate electrodes 403 of pixels for every two rows face each other. FIG. 5 shows only eight pixels constituted by four columns and two rows (four pairs of pixels) of a region A in which the image height is high in the −X direction, four pixels constituted by four columns and one row (two pairs of pixels) in a region B in the vicinity of the center of the image sensor 4, and eight pixels constituted by four columns and two rows (four pairs of pixels) of a region C in which the image height is high in the +X direction, out of the two-dimensionally arranged pixels.

Each pixel 40 has one microlens 400, and on a lower side in the Z direction in FIG. 5, a plurality of photoelectric conversion portions 401a and 401b are arranged in a pixel group I, and photoelectric conversion portions 402a and 402b are arranged in a pixel group II. A floating diffusion region 404 (storage portion) is arranged in a region adjacent to the photoelectric conversion portions 401a and 401b, and 402a and 402b in the Y direction. The transfer gate electrodes 403, which are gates of transfer transistors, transfer electric charges generated in the photoelectric conversion portions 401a, 401b, 402a and 402b to the floating diffusion regions 404. In the image sensor 4, the transfer gate electrodes 403 of two rows constituting the same pixel group are arranged to face each other, and the floating diffusion region 404 is shared over two rows at the position at which these transfer gate electrodes 403 face each other. In other words, a configuration is adopted in which each of the floating diffusion regions 404 is shared by four photoelectric conversion portions 401a, 401b, 402a and 402b of a pair of pixels. Note that in the fourth embodiment, a configuration is adopted in which the floating diffusion region 404 is shared by four photoelectric conversion portions, but the present invention is not limited thereto.

The transfer gate electrode 403 and each of the photoelectric conversion portions 401a, 401b, 402a and 402b are configured to have an overlapping portion S relative to the pixel arrangement plane, when viewed from the Z direction. At this time, the overlapping portions S are designed to have the same shape and to be at the same position in a pair of pixels in a pixel group, regarding all the pixel groups. Unlike the image sensor 3 in the third embodiment, the shapes and the positions of the overlapping portions S in two rows in which the transfer gate electrodes 403 face each other are not the same in unit pixels. This can cause the occurrence of stripes in a captured image obtained by totaling performed with a plurality of photoelectric conversion portions. However, a configuration in which the cycle of pixel groups and the cycle of a Bayer array constituted by R, Gr, Gb and B color filters are the same makes it possible to resolve the difference in the shapes and the positions between the overlapping portions S in a pixel group, by performing demosaicing processing on the captured image at the time of development.

Note that a method for dividing a photoelectric conversion portion of the image sensor 4 in the fourth embodiment is similar to that of the image sensor 3 in the third embodiment, and thus description thereof is omitted here.

Next, an advantage obtained by arranging the transfer gate electrodes 403 of two rows constituting the same pixel group so as to face each other will be described with reference to FIGS. 6A and 6B. FIGS. 6A and 6B schematically show states of pupil separation in a region at an image height on the −X side in the first row of the pixel group I and the second row of the pixel group I in FIG. 5. The pixel group I is a pixel group according to which the set pupil distance is Ds1. Regarding the first row (FIG. 6A), a region R (hereinafter, referred to as an "influence region") affected by the transfer gate electrode 403 is on a +Y side of the pupil region. On the other hand, regarding the second row (FIG. 6B), a similar influence region R is on a −Y side of the pupil region. In the vicinity of this influence region R, the photoelectric conversion portion is equally divided in the right and left directions of the figure, such that the shape obtained by totaling a plurality of light receiving portions is the same in the same row. Therefore, regarding an object whose image is formed through the vicinity of the influence region R of the pupil region, focus detection performance is deteriorated since the pupil region is not equally divided at the pupil distance Ds1. In other words, in the vicinity of this influence region R, the set pupil distance is not Ds1 as desired. In view of this, it is made possible to reduce the deterioration in focus detection performance in the vicinity of this influence region R by arranging the transfer gate electrodes 403 of two rows constituting the same pixel group to face each other, adding the signals of the two rows and performing focus detection. Accordingly, the influence of the influence region R on focus detection can be reduced.

In the fourth embodiment, a plurality of pixel groups of the image sensor 4 are set so as to correspond to the two pupil distances Ds1 and Ds2, but the present invention is not limited thereto, and the image sensor 4 may include more pixel groups corresponding to more pupil distances. This may include a pixel group corresponding to the same pupil distance as the set pupil distance Ds0, namely, a pixel group in which each of a plurality of photoelectric conversion portions is equally divided.

As described above, according to the fourth embodiment, in the image sensor 4, it is possible to provide a plurality of division patterns of a photoelectric conversion portion that are suitable for focus detection, while reducing the influence of the influence region on the captured image. It is also possible to reduce the influence of the influence region on focus detection by arranging the transfer gate electrodes in the pixel group to face each other.

Note that in the third and fourth embodiments above, the boundaries are all expressed as straight lines, but the present invention is not limited thereto, and curved lines may be included. Moreover, pupil separation is performed as division into two in the X direction, but the present invention is not limited thereto, and, for example, division into three or more regions such as division into four may be used. Even in such a case, a similar effect can be obtained if the overlapping portions S of the transfer gate electrodes and the photoelectric conversion portions in the pixels of all the pixel groups have the same shape and are at the same position.

Note that in the third embodiment, the arrangement of the pixel group I and the pixel group II may be other than that shown in FIGS. 4A to 4C. For example, a pattern may be repeated in which the pixel group I is arranged over a plurality of rows, and the pixel group II is also similarly arranged over a plurality of rows. In addition, an arrangement may be adopted in which a portion of the pixel group I consecutively arranged over a plurality of rows is replaced with the pixel group II, and vice versa. Moreover, a configuration may be adopted in which a row shown in the region B in FIG. 4A and constituted only by pixels in which equal division has been performed is provided as the pixel group III, which is arranged in combination with the pixel group I and the pixel group II.

Fifth Embodiment

Figure 7:
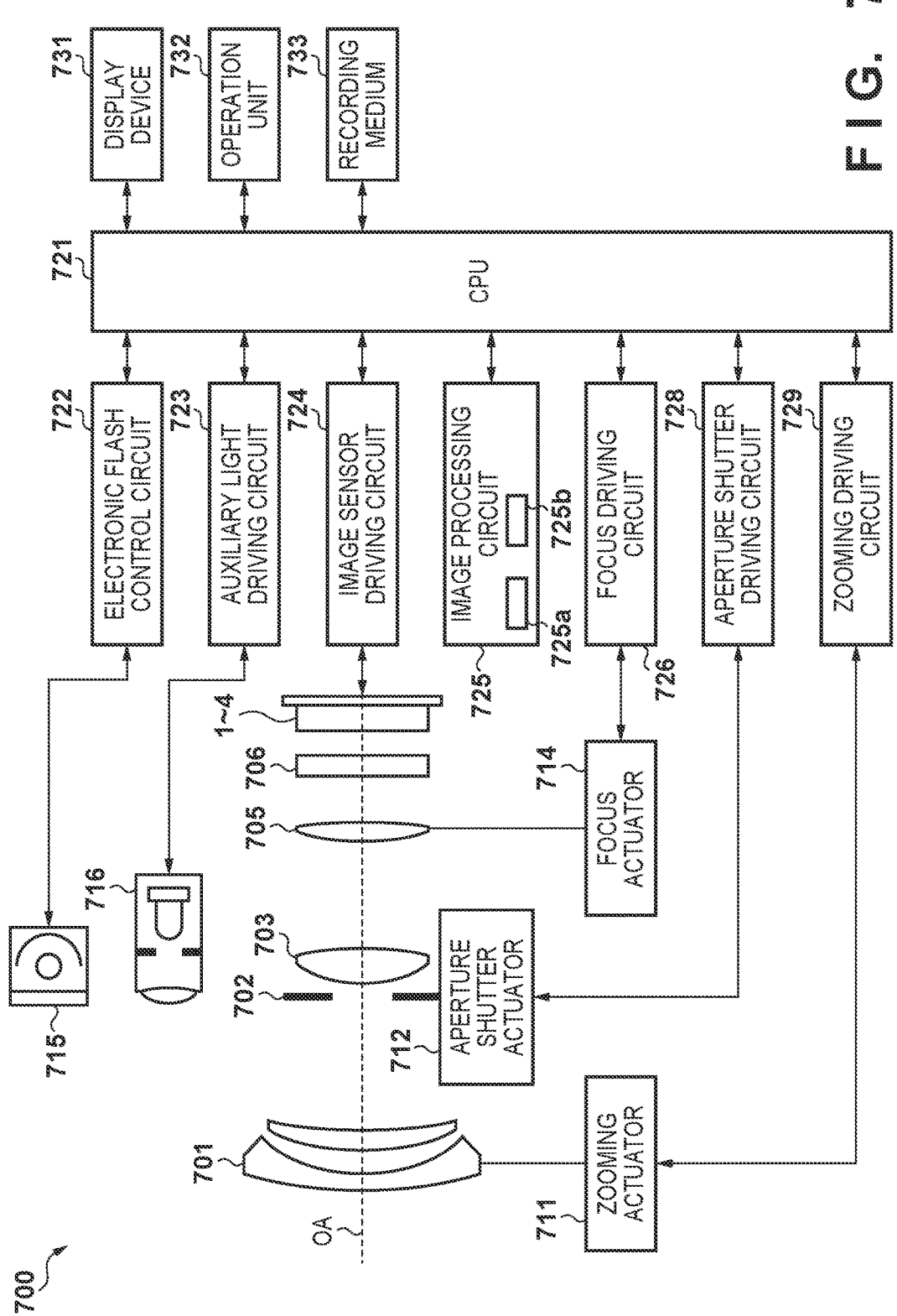
FIG. 7 is a schematic diagram showing a configuration of an image capturing apparatus in a fifth embodiment.
Figure 8A:
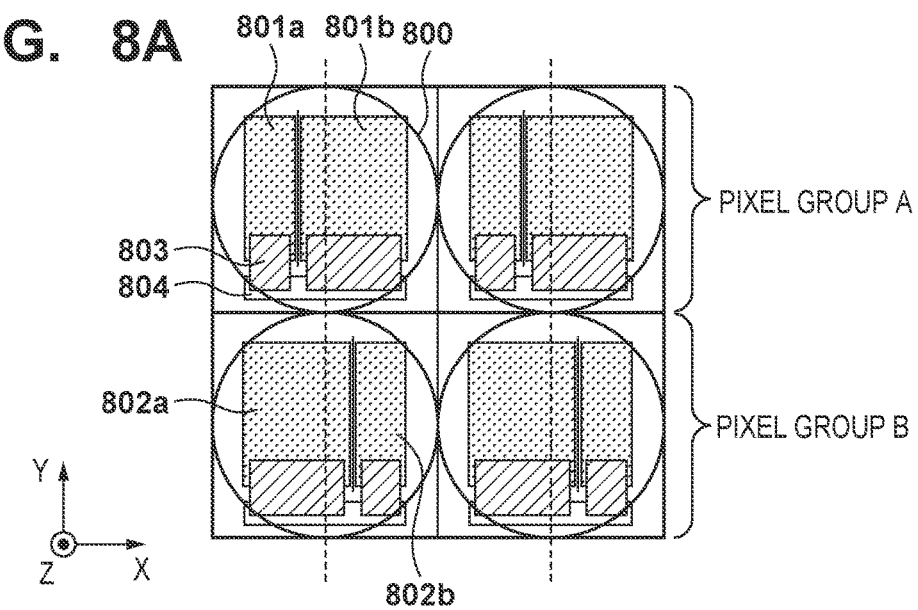
FIGS. 8A to 8E are schematic diagrams illustrating pixel configurations of a conventional image sensor.
Figure 8B:
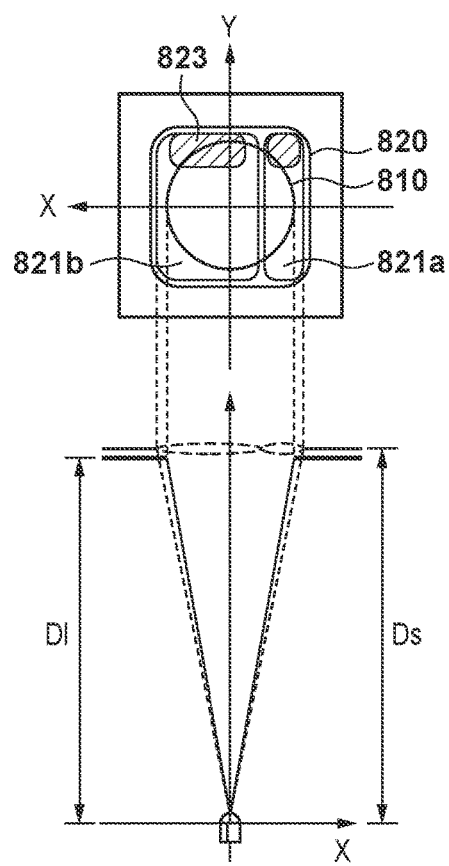
Figure 8C:
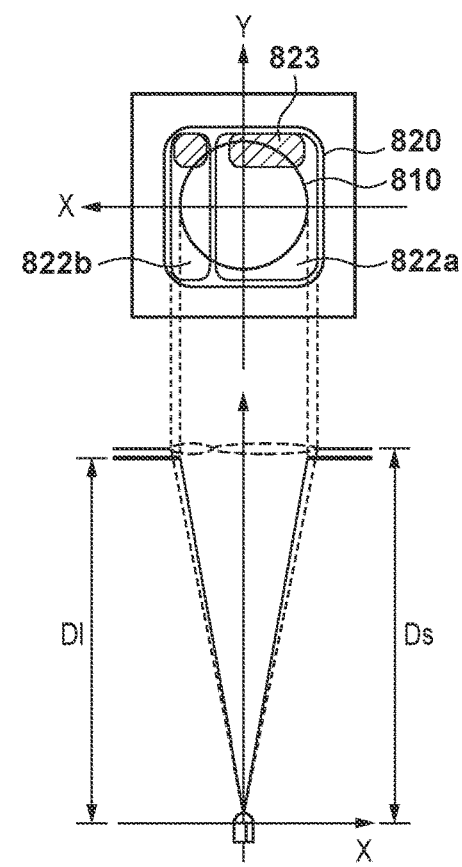
Figure 8D:
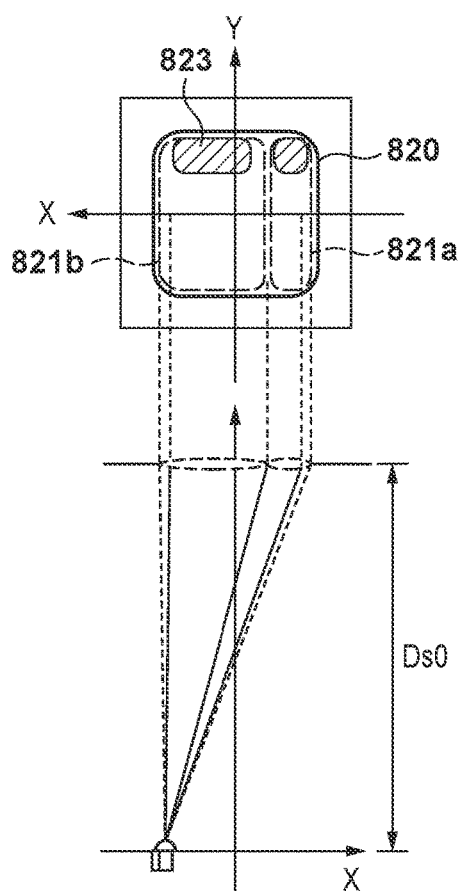
Figure 8E:
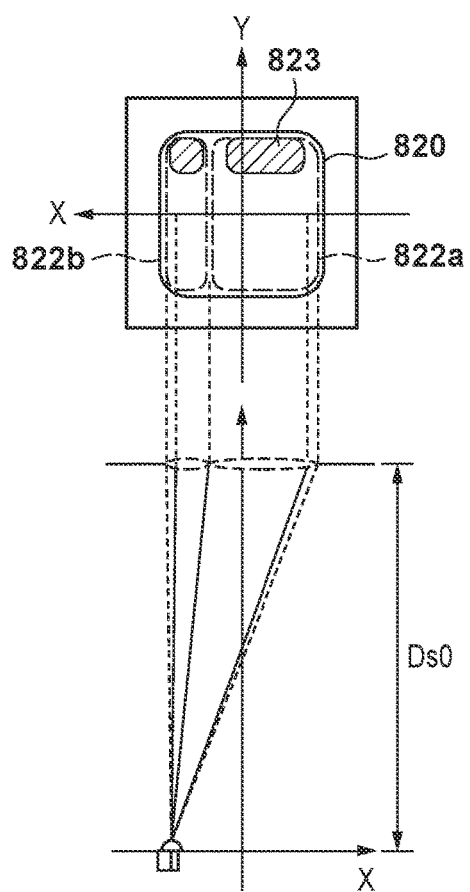

Next, a fifth embodiment of the present invention will be described. FIG. 7 shows the schematic configuration of a camera, which is an image capturing apparatus 700 that has any one of the image sensors 1 to 4 in the first to fourth embodiments of the present invention. In FIG. 7, the image capturing apparatus 700 is a digital camera system provided with a camera body and an interchangeable lens (imaging optical system) attachable to/detachable from the camera body. However, this embodiment is not limited thereto, and can also be applied to an image capturing apparatus in which a camera body and a lens that collects light from an object are configured integrally.

A first lens group 701 is arranged frontmost (object side) in a plurality of lens groups constituting an imaging lens (imaging optical system), and is held by a lens barrel in a state of being capable of advancing/retreating in the direction of an optical axis OA (optical axis direction). A shutter 702 (aperture) serving also as an aperture adjusts the light amount during shooting by the opening diameter thereof being adjusted, and functions as an exposure duration adjusting shutter during still image shooting. A second lens group 703 advances/retreats in the optical axis direction integrally with the shutter 702 serving also as an aperture, and has a zooming function for performing a magnification operation in conjunction with an advancing/retreating operation of the first lens group 701. A third lens group 705 is a focus lens group that performs focus adjustment (a focusing operation) by advancing/retreating in the optical axis direction. An optical low-pass filter 706 is an optical element for reducing false color and moire of a captured image.

The image sensor 1 (or any one of the image sensors 2 to 4) performs photoelectric conversion on an object image (optical image) via the imaging optical system, and, for example, is constituted by a CMOS sensor or a CCD sensor and peripheral circuits thereof.

A zooming actuator 711 performs a magnification operation by moving the first lens group 701 and the second lens group 703 in the optical axis direction by rotating (driving) a cam barrel (not illustrated). An aperture shutter actuator 712 controls the opening diameter of the shutter 702 serving also as an aperture so as to adjust a light amount (shooting light amount), and controls an exposure duration during still image shooting. A focus actuator 714 moves the third lens group 705 in the optical axis direction so as to perform focus adjustment.

An electronic flash 715 is an illumination apparatus used for illuminating an object. A flashing illumination apparatus provided with a xenon tube or an illumination apparatus provided with an LED (light emitting diode) that continuously emits light is used as the electronic flash 715. An AF auxiliary light emission unit 716 projects the image of a mask having a predetermined opening pattern on an object via a light projecting lens. Accordingly, it is possible to improve focus detection ability for a dark object and a low-contrast object.

A CPU 721 is a control apparatus for performing various types of control of the image capturing apparatus 700. The image capturing apparatus 700 has a calculation unit, a ROM, a RAM, an A/D converter, a D/A converter, a communication interface circuit (not shown) and so forth. The CPU 721 reads out and executes a predetermined program stored in the ROM, and thereby drives various circuits of the image capturing apparatus 700 so as to control a series of operations such as focus detection (AF), shooting, image processing or recording.

An electronic flash control circuit 722 performs illumination control of the electronic flash 715 in synchronization with a shooting operation. An auxiliary light driving circuit 723 performs illumination control of the AF auxiliary light emission unit 716 in synchronization with a focus detection operation. An image sensor driving circuit 724 controls an imaging operation of the image sensor 1 (or any one of the image sensors 2 to 4), A/D converts obtained image signals and transmits the image signals to the CPU 721.

An image processing circuit 725 (image processing apparatus) performs processing such as γ (gamma) conversion, color interpolation, or JPEG (Joint Photographic Experts Group) compression on image data that has been output from the image sensor 1 (or any one of the image sensors 2 to 4). In the fifth embodiment, the image processing circuit 725 has an obtaining unit 725a and an image processing unit 725b. The obtaining unit 725a obtains imaging pixels and at least one parallax image from the image sensor 1 (or any one of the image sensors 2 to 4). The imaging pixel forms an image generated by combining a plurality of signals of the photoelectric conversion portions 101a and 101b, 102a and 102b, 201a, 201b, 202a and 202b, 301a and 301b, 302a and 302b, 401a and 401b, or 402a and 402b that receive a light beam that has passed through pupil portion regions of an imaging optical system that are different from each other. Hereinafter, the photoelectric conversion portions 101a, 102a, 201a, 202a, 301a, 302a, 401a and 402a are referred to as photoelectric conversion portions A, and the photoelectric conversion portions 101b, 102b, 201b, 202b, 301b, 302b, 401b and 402b are referred to as photoelectric conversion portions B. The parallax image is an image generated from the signals of the photoelectric conversion portions 101a and 101b, 102a and 102b, 201a, 201b, 202a and 202b, 301a and 301b, 302a and 302b, 401a and 401b, or 402a and 402b.

A focus driving circuit 726 drives the focus actuator 714 based on a focus detection result, and moves the third lens group 705 along the optical axis direction so as to perform focus adjustment. An aperture shutter driving circuit 728 drives the aperture shutter actuator 712 so as to control the opening diameter of the shutter 702 serving also as an aperture. The zooming driving circuit 729 drives the zooming actuator 711 according to a zooming operation by the photographer.

A display device 731 is constituted to include an LCD (liquid crystal display apparatus), for example. The display device 731 displays information regarding a shooting mode of the image capturing apparatus 700, a preview image before shooting, an image for checking after shooting, a display image of in-focus state during focus detection or the like. An operation unit 732 (operation switch group) is constituted to include a power supply switch, a release (shooting trigger) switch, a zooming operation switch, a shooting mode selection switch and the like. The release switch is a two-stage switch, namely, a half-pressed state (state where SW1 is ON) and a fully-pressed state (state where SW2 is ON). A recording medium 733 is a flash memory removable from the image capturing apparatus 700, for example, and records captured images (image data).

Next, a focus detection operation in the image capturing apparatus 700 of the fifth embodiment will be described. As described above, the pixel groups of the image sensor 1 (or any one of the image sensors 2 to 4) include a plurality of photoelectric conversion portions (the photoelectric conversion portions A and the photoelectric conversion portions B). Therefore, a pair of object images having parallax can be obtained from a pair of light beams from pupil regions different from each other, on the light receiving surfaces. The pair of object images are respectively equivalent to image data 1 and image data 2. In addition, the parallax of the image data 1 and the image data 2 changes according to the focal position of the imaging lens and the like. Specifically, the parallax is eliminated in an in-focus state, and the parallax increases according to a shift amount from an in-focus state. In other words, the parallax amount differs according to a focus state. Accordingly, it is possible to obtain an appropriate focus position, and to obtain the distance to the object in image data, using a parallax amount generated between the image data.

A method for obtaining a parallax amount using Expression (3) will be illustrated.

$$C(s) = \sum_{x=p}^{q} |A_x - B_{x+s}| \qquad (3)$$

Note that Ax and Bx are output signal values of a plurality of photoelectric conversion portions of a row specified in image data. s is a shift amount, and q and p are predetermined column numbers. Accordingly, a correlation value C can be obtained using the difference between the signals of the photoelectric conversion portions A and the signal values of the photoelectric conversion portions B shifted in the row direction by s pixels. The shift amount s is changed within a predetermined range and the correlation value C is obtained, and the shift amount s that is a minimum is equivalent to the parallax amount. A focus position can then be calculated by multiplying the shift amount s that is a minimum by a predetermined coefficient. Focus adjustment can be performed on the object by controlling the focus driving circuit 726 based on this focus position.

Note that in the fifth embodiment, the signal of the photoelectric conversion portion B is shifted, but the signal of the photoelectric conversion portions A may be shifted. Moreover, a parallax amount may be calculated using an expression other than Expression (3).

In this manner, the distance to the object at any location on the screen can be obtained by using the image data 1 and 2 that have parallax and have been generated from the signals of the photoelectric conversion portions A and B. Also, image data 3 can be obtained by adding the image data 1 and 2. That is, the image data 3 is equivalent to a composite image of the image data 1 and the image data 2. In other words, the image sensor 1 (or any one of the image sensors 2 to 4) according to the present invention can obtain both image data used for a focus detection operation and image data used for capturing an object image. In addition, as an embodiment, the image data 1 and the image data 2 are combined to obtain the image data 3, but the present invention is not limited thereto. For example, a configuration may be adopted in which the image data 1 and the image data 3 are obtained from the image sensor 1 (or any one of the image sensors 2 to 4), and the image data 2 is obtained by subtracting the image data 1 from the image data 3. Moreover, in the fifth embodiment, an example has been described in which a light receiving surface is divided into two, but the light receiving surface may be divided into three or more. Note that in the case of combining the image data 1 and the image data 2 in order to generate the image data 3, predetermined weighting may be performed, and the addition may be performed after one of the images is processed.

Other Embodiments

Note that the present invention may be applied to a system constituted by a plurality of devices, or an apparatus constituted by one device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-078434, filed on Apr. 8, 2016, and Japanese Patent Application No. 2016-177864, filed on Sep. 12, 2016, which are hereby incorporated by reference herein in their entirety.

What is claimed is:

1. An image sensor comprising:
a pixel portion that is constituted by a plurality of pixels, and includes a first pixel group and a second pixel group,
wherein each of the pixels included in the first pixel group and the second pixel group includes:
a microlens;
a plurality of photoelectric conversion portions corresponding to the microlens; and
a plurality of transfer gates that respectively correspond to the photoelectric conversion portions, and have transfer gate electrodes covering same partial regions in the photoelectric conversion portions, and
an average position of barycenters of respective light receivable regions of the photoelectric conversion portions corresponding to the each microlens of the first pixel group and an average position of barycenters of respective light receivable regions of the photoelectric conversion portions corresponding to the each microlens of the second pixel group are offset in opposite directions to each other in the pixels.

2. The image sensor according to claim 1, wherein the barycenters of the respective light receivable regions of the photoelectric conversion portions corresponding to the each microlens of the first pixel group and the barycenters of the respective light receivable regions of the photoelectric conversion portions corresponding to the each microlens of the second pixel group are at the same position in the pixels.

3. The image sensor according to claim 1, wherein an average position of the barycenters of the respective light receivable regions of the photoelectric conversion portions included in each pixel of the first pixel group and an average position of the barycenters of the respective light receivable regions of the photoelectric conversion portions included in each pixel of the second pixel group are offset relative to a division direction of the photoelectric conversion portions in the pixels.

4. The image sensor according to claim 1, wherein the higher an image height in the pixel portion is, the more the average position for the first pixel group and the average position for the second pixel group are separated from each other.

5. The image sensor according to claim 4, wherein at a central image height in the pixel portion, the average position for the first pixel group coincides with the average position for the second pixel group.

6. The image sensor according to claim 1, wherein each of the pixels further includes a storage portion for storing electric charges generated in the photoelectric conversion portion, and the storage portion is connected to the plurality of transfer gates.

7. The image sensor according to claim 6, wherein the storage portions in the first pixel group and the storage portions in the second pixel group are arranged in the same direction.

8. An image sensor comprising:
a pixel portion that is constituted by a plurality of pixels, and includes a first pixel group and a second pixel group,
wherein each of the pixels included in the first pixel group and the second pixel group includes:
a microlens;
a plurality of photoelectric conversion portions corresponding to the microlens;
a division band that separates the photoelectric conversion portions; and
a plurality of transfer gates that respectively correspond to the photoelectric conversion portions, and have transfer gate electrodes covering same partial regions in the photoelectric conversion portions, and
a position of the division band included in the first pixel group relative to barycenters of respective light receivable regions of the photoelectric conversion portions corresponding to the each microlens of the first pixel group and a position of the division band included in the second pixel group relative to barycenters of respective light receivable regions of the photoelectric conversion portions corresponding to the each microlens of the second pixel group are offset in opposite directions to each other in the pixels.

9. The image sensor according to claim 8, wherein
the division band includes a first division band in the light receivable region and a second division band in the partial region,
a position of the first division band included in each pixel of the first pixel group and a position of the first division band included in each pixel of the second pixel group are offset in opposite directions to each other in the pixels, and a position of the second division band included in each pixel of the first pixel group and a position of the second division band included in each pixel of the second pixel group are the same position in the pixels.

10. An image sensor comprising:
a pixel portion that is constituted by a plurality of pixels, and includes a first pixel group and a second pixel group,
wherein each of the pixels included in the first pixel group and the second pixel group includes:
a microlens;
a plurality of photoelectric conversion portions corresponding to the microlens; and
a plurality of transfer gates that respectively correspond to the photoelectric conversion portions, and have transfer gate electrodes covering same partial regions in the photoelectric conversion portions, and
division boundaries of the photoelectric conversion portions in the first pixel group and the second pixel group changes in opposite directions to each other according to an image height in a division direction of the photoelectric conversion portions, such that pupil regions at predetermined pupil distances different from each other are substantially equally divided regardless of the image height.

11. The image sensor according to claim 10, wherein
the pixel portion further includes a plurality of microlenses respectively arranged in the pixels,
the microlenses are arranged to have a predetermined shrinking rate from an image height center of the pixel portion, and
in a pixel in which a division boundary of the photoelectric conversion portions passes through a center of the pixel, if a pupil distance at which a pupil region is substantially equally divided regardless of an image height of the division direction of the photoelectric conversion portions is assumed to be a reference pupil distance, a pupil distance of the first pixel group and a pupil distance of the second pixel group are different from the reference pupil distance.

12. The image sensor according to claim 11, wherein the pupil distance of the first pixel group is shorter than the reference pupil distance, and the pupil distance of the second pixel group is longer than the reference pupil distance.

13. The image sensor according to claim 12, wherein the division boundary of the first pixel group and the division boundary of the second pixel group are offset in opposite directions to each other from a center of each pixel at each image height.

14. The image sensor according to claim 11, wherein letting the reference pupil distance be Ds0, the pupil distance of the first pixel group be Ds1, and the pupil distance of the second pixel group be Ds2, $(1/Ds1+1/Ds2)/2=1/Ds0$ is satisfied.

15. The image sensor according to claim 10, wherein the higher the image height in the pixel portion is, the more the division boundaries of the photoelectric conversion portions in the first pixel group and the second pixel group are separated from the center of each pixel.

16. The image sensor according to claim 10, wherein the division boundary of the photoelectric conversion portions of the first pixel group and the division boundary of the photoelectric conversion portions of the second pixel group coincide at a central image height of the pixel portion.

17. An image sensor comprising:
a pixel portion that is constituted by a plurality of pixels, and includes a first pixel group and a second pixel group,
wherein each of the pixels included in the first pixel group and the second pixel group includes:
a microlens;
a plurality of photoelectric conversion portions corresponding to the microlens; and
a plurality of transfer gates that respectively correspond to the photoelectric conversion portions, and have transfer gate electrodes covering partial regions of a same size in the photoelectric conversion portions,
the pixel portion has a plurality of storage portions for storing electric charges transferred from the photoelectric conversion portions via the transfer gates,
each of the storage portions store the electric charges transferred from the photoelectric conversion portions of a plurality of pixels facing each other with the transfer gates therebetween, and
division boundaries of the photoelectric conversion portions in the first pixel group and the second pixel group changes in opposite directions to each other according to an image height in a division direction of the photoelectric conversion portions, such that pupil regions at predetermined pupil distances different from each other are substantially equally divided regardless of the image height.

18. The image sensor according to claim 17,
an electric charge of one photoelectric conversion portion is transferred from each pixel to the storage portion via a pair of the transfer gates that face each other, and added.

19. The image sensor according to claim 17, wherein the pixel portion further includes a plurality of microlenses respectively arranged in the pixels, the microlenses are arranged to have a predetermined shrinking rate from an image height center of the pixel portion, and
in a pixel in which a division boundary of the photoelectric conversion portions passes through a center of the pixel, if a pupil distance at which a pupil region is substantially equally divided regardless of an image height of the division direction of the photoelectric conversion portions is assumed to be a reference pupil distance, a pupil distance of the first pixel group and a pupil distance of the second pixel group are different from the reference pupil distance.

20. The image sensor according to claim 19, wherein the pupil distance of the first pixel group is shorter than the reference pupil distance, and the pupil distance of the second pixel group is longer than the reference pupil distance.

21. The image sensor according to claim 20, wherein the division boundary of the first pixel group and the division boundary of the second pixel group are offset in opposite directions to each other from a center of each pixel at each image height.

22. The image sensor according to claim 19, wherein letting the reference pupil distance be Ds0, the pupil distance of the first pixel group be Ds1, and the pupil distance of the second pixel group be Ds2, $(1/Ds1+1/Ds2)/2=1/Ds0$ is satisfied.

23. The image sensor according to claim 17, wherein the higher the image height in the pixel portion is, the more the division boundaries of the photoelectric conversion portions in the first pixel group and the second pixel group are separated from the center of each pixel.

24. The image sensor according to claim 17, wherein the division boundary of the photoelectric conversion portions of the first pixel group and the division boundary of the photoelectric conversion portions of the second pixel group coincide at a central image height of the pixel portion.

25. An image sensor comprising:
a pixel portion that is constituted by a plurality of pixels, and includes a first pixel group and a second pixel group,
wherein each of the pixels included in the first pixel group and the second pixel group includes:
a microlens;
a plurality of photoelectric conversion portions, corresponding to the microlens, whose light receiving surfaces are divided in a predetermined division direction at a predetermined division boundary; and
a plurality of transfer gates that respectively correspond to the photoelectric conversion portions, and have transfer gate electrodes covering same partial regions in the photoelectric conversion portions, and
division boundaries included in the first pixel group and the second pixel group change in opposite directions to each other in the division direction according to an image height on the light receiving surface.

26. The image sensor according to claim 25, wherein the transfer gates included in the first pixel group and the second pixel group adjacent in a direction orthogonal to the division direction are connected to the same storage portion for storing electric charges.

27. An image capturing apparatus comprising:
an image sensor including a pixel portion that is constituted by a plurality of pixels, and includes a first pixel group and a second pixel group, wherein each of the pixels included in the first pixel group and the second pixel group includes:

a microlens;

a plurality of photoelectric conversion portions corresponding to the microlens; and a plurality of transfer gates that respectively correspond to the photoelectric conversion portions, and have transfer gate electrodes covering same partial regions in the photoelectric conversion portions, and an average position of barycenters of respective light receivable regions of the photoelectric conversion portions corresponding to the each microlens of the first pixel group and an average position of barycenters of respective light receivable regions of the photoelectric conversion portions corresponding to the each microlens of the second pixel group are offset in opposite directions to each other in the pixels; and a lens for collecting light from an object to the image sensor.

28. An image capturing apparatus comprising:

an image sensor including a pixel portion that is constituted by a plurality of pixels, and includes a first pixel group and a second pixel group, wherein each of the pixels included in the first pixel group and the second pixel group includes:

a microlens;

a plurality of photoelectric conversion portions corresponding to the microlens;

a division band that separates the photoelectric conversion portions; and a plurality of transfer gates that respectively correspond to the photoelectric conversion portions, and have transfer gate electrodes covering same partial regions in the photoelectric conversion portions, and a position of the division band included in the first pixel group relative to barycenters of respective light receivable regions of the photoelectric conversion portions corresponding to the each microlens of the first pixel group and a position of the division band included in the second pixel group relative to barycenters of respective light receivable regions of the photoelectric conversion portions corresponding to the each microlens of the second pixel group are offset in opposite directions to each other in the pixels; and a lens for collecting light from an object to the image sensor.

29. An image capturing apparatus comprising:

an image sensor including a pixel portion that is constituted by a plurality of pixels, and includes a first pixel group and a second pixel group, wherein each of the pixels included in the first pixel group and the second pixel group includes:

a microlens;

a plurality of photoelectric conversion portions corresponding to the microlens; and a plurality of transfer gates that respectively correspond to the photoelectric conversion portions, and have transfer gate electrodes covering same partial regions in the photoelectric conversion portions, and division boundaries of the photoelectric conversion portions in the first pixel group and the second pixel group changes in opposite directions to each other according to an image height in a division direction of the photoelectric conversion portions, such that pupil regions at predetermined pupil distances different from each other are substantially equally divided regardless of the image height; and a lens for collecting light from an object to the image sensor.

30. An image capturing apparatus comprising:

an image sensor including a pixel portion that is constituted by a plurality of pixels, and includes a first pixel group and a second pixel group, wherein each of the pixels included in the first pixel group and the second pixel group includes:

a microlens;

a plurality of photoelectric conversion portions corresponding to the microlens; and a plurality of transfer gates that respectively correspond to the photoelectric conversion portions, and have transfer gate electrodes covering partial regions of a same size in the photoelectric conversion portions, the pixel portion has a plurality of storage portions for storing electric charges transferred from the photoelectric conversion portions via the transfer gates, each of the storage portions store the electric charges transferred from the photoelectric conversion portions of a plurality of pixels facing each other with the transfer gates therebetween, and division boundaries of the photoelectric conversion portions in the first pixel group and the second pixel group changes in opposite directions to each other according to an image height in a division direction of the photoelectric conversion portions, such that pupil regions at predetermined pupil distances different from each other are substantially equally divided regardless of the image height; and a lens for collecting light from an object to the image sensor.

31. An image capturing apparatus comprising:

an image sensor comprising a pixel portion that is constituted by a plurality of pixels, and includes a first pixel group and a second pixel group, wherein each of the pixels included in the first pixel group and the second pixel group includes:

a microlens;

a plurality of photoelectric conversion portions corresponding to the microlens whose light receiving surfaces are divided in a predetermined division direction at a predetermined division boundary; and a plurality of transfer gates that respectively correspond to the photoelectric conversion portions, and have transfer gate electrodes covering same partial regions in the photoelectric conversion portions, and division boundaries included in the first pixel group and the second pixel group change in opposite directions to each other in the division direction according to an image height on the light receiving surface; and a lens for collecting light from an object to the image sensor.

32. An image sensor comprising:

a pixel portion that is constituted by a plurality of pixels, and includes a first pixel group and a second pixel group, wherein each of the pixels included in the first pixel group and the second pixel group includes:

a microlens;

a plurality of photoelectric conversion portions corresponding to the microlens; and a plurality of transfer gates that respectively correspond to the photoelectric conversion portions, and have transfer gate electrodes covering same partial regions in the photoelectric conversion portions, and
an average position of barycenters of respective light receivable regions of the photoelectric conversion portions corresponding to the each microlens of the first pixel group and an average position of barycenters of respective light receivable regions of the photoelectric conversion portions corresponding to the each microlens of the second pixel group are at different positions in a division direction of the photoelectric conversion portions in the pixels.

* * * * *